(12) United States Patent
Choi et al.

(10) Patent No.: US 11,214,870 B2
(45) Date of Patent: Jan. 4, 2022

(54) CHEMICAL VAPOR DEPOSITION SYSTEM INCLUDING GROUND STRAP BAR

(71) Applicant: Samsung Display Co., Ltd., Yongin-Si (KR)

(72) Inventors: Jaihyuk Choi, Hwaseong-si (KR); Jong-hoon Park, Asan-si (KR); Kyungjoo Min, Yongin-si (KR); Wonwoong Park, Seoul (KR); Sukwon Jung, Sejong-si (KR); Hyunwoo Joo, Seoul (KR); Myungsoo Huh, Suwon-si (KR)

(73) Assignee: Samsung Display Co., Ltd.

( * ) Notice: Subject to any disclaimer, the term of this patent is extended or adjusted under 35 U.S.C. 154(b) by 244 days.

(21) Appl. No.: 15/990,051

(22) Filed: May 25, 2018

(65) Prior Publication Data

US 2018/0340258 A1    Nov. 29, 2018

(30) Foreign Application Priority Data

May 29, 2017    (KR) .......................... 10-2017-0066330

(51) Int. Cl.
*C23C 16/458* (2006.01)
*C23C 16/44* (2006.01)
(Continued)

(52) U.S. Cl.
CPC .......... *C23C 16/50* (2013.01); *C23C 16/4401* (2013.01); *C23C 16/458* (2013.01); *C23C 16/4583* (2013.01); *C23C 16/4585* (2013.01); *C23C 16/45544* (2013.01); *C23C 16/5096* (2013.01); *H01J 37/32577* (2013.01); *H01J 37/32697* (2013.01); *H01J 37/32715* (2013.01); *H01J 37/32807* (2013.01);
(Continued)

(58) Field of Classification Search
CPC ............. C23C 16/4585; C23C 16/4401; H01J 37/32697
See application file for complete search history.

(56) References Cited

U.S. PATENT DOCUMENTS 6,221,221 B1 * 4/2001 Al-Shaikh ......... H01J 37/32577
204/298.02
6,933,442 B2 * 8/2005 Franks, Jr. ............. H01R 4/643
174/135

(Continued)

FOREIGN PATENT DOCUMENTS

KR    10-2005-0015715 A    2/2005
KR    10-0786273 B1    12/2007

(Continued)

*Primary Examiner* — Karl Kurple
(74) *Attorney, Agent, or Firm* — Innovation Counsel LLP (57) ABSTRACT

A chemical vapor deposition (CVD) system may include a chamber, a susceptor provided in the chamber to support a substrate, a gas distribution part provided over the susceptor, a first ground strap bar provided on a bottom inner surface of the chamber and electrically connected to the chamber, a second ground strap bar provided on a bottom surface of the susceptor and electrically connected to the susceptor, and a plurality of ground straps electrically connected to the first and second ground strap bars, each of the plurality of ground straps including two opposite portions that are fastened to the first and second ground strap bars, respectively.

13 Claims, 9 Drawing Sheets

(51) Int. Cl.
*H01J 37/32* (2006.01)
*C23C 16/50* (2006.01)
*H01L 21/687* (2006.01)
*C23C 16/509* (2006.01)
*C23C 16/455* (2006.01)
*H01R 9/16* (2006.01)
*H01R 9/00* (2006.01)
*H01L 21/02* (2006.01)

(52) U.S. Cl.
CPC .......... *H01L 21/68785* (2013.01); *H01J 2237/3321* (2013.01); *H01L 21/0217* (2013.01); *H01L 21/0262* (2013.01); *H01L 21/02164* (2013.01); *H01L 21/02274* (2013.01); *H01L 21/02532* (2013.01); *H01L 21/02576* (2013.01); *H01L 21/02592* (2013.01); *H01R 9/00* (2013.01); *H01R 9/16* (2013.01)

(56) References Cited

U.S. PATENT DOCUMENTS

| | | | |
|---|---|---|---|
| 7,083,702 B2* | 8/2006 | Blonigan | H01J 37/32082 156/345.47 |
| 7,534,301 B2 | 5/2009 | White et al. | |
| 7,743,730 B2* | 6/2010 | Kholodenko | H01J 37/32055 118/723 E |
| 7,959,735 B2* | 6/2011 | Sterling | H01L 21/68757 118/728 |
| 7,972,470 B2* | 7/2011 | Furuta | H01J 37/32623 156/345.47 |
| 8,004,293 B2* | 8/2011 | White | C23C 16/4585 324/713 |
| 8,062,717 B2* | 11/2011 | Blonigan | H01J 37/32577 427/569 |
| 8,381,677 B2* | 2/2013 | Park | H01J 37/32623 118/723 E |
| 8,877,301 B2* | 11/2014 | Furuta | H01J 37/32623 427/569 |
| 9,111,968 B2* | 8/2015 | Kholodenko | H01J 37/32082 |
| 9,382,621 B2* | 7/2016 | Choi | C23C 16/4585 |
| 9,905,402 B2* | 2/2018 | Kholodenko | H01J 37/32532 |
| 10,580,623 B2* | 3/2020 | Ye | H01J 37/32577 |
| 2004/0250955 A1* | 12/2004 | Blonigan | H01J 37/32577 156/345.51 |
| 2006/0060302 A1* | 3/2006 | White | H01J 37/32174 156/345.28 |
| 2006/0231029 A1* | 10/2006 | Blonigan | H01J 37/32082 118/722 |
| 2007/0137573 A1* | 6/2007 | Kholodenko | H01J 37/32174 118/723 E |
| 2008/0116876 A1* | 5/2008 | White | H01L 21/67069 324/76.11 |
| 2008/0187682 A1* | 8/2008 | Park | H01J 37/32697 427/569 |
| 2008/0194169 A1* | 8/2008 | Sterling | H01L 21/68785 445/73 |
| 2008/0274297 A1* | 11/2008 | Furuta | C23C 16/4585 427/569 |
| 2010/0000684 A1* | 1/2010 | Choi | H01J 37/32568 156/345.43 |
| 2010/0089319 A1* | 4/2010 | Sorensen | C23C 16/5096 118/723 E |
| 2010/0196626 A1* | 8/2010 | Choi | H01J 37/32091 427/569 |
| 2010/0263592 A1* | 10/2010 | Kholodenko | H01J 37/32458 118/723 E |
| 2011/0236599 A1* | 9/2011 | Furuta | C23C 16/5096 427/569 |
| 2015/0053135 A1* | 2/2015 | Chung | H01J 37/32091 118/723 E |
| 2015/0325416 A1* | 11/2015 | Kholodenko | H01J 37/32091 313/15 |

FOREIGN PATENT DOCUMENTS

| KR | 10-2010-0090675 A | 8/2010 |
|---|---|---|
| KR | 10-1441892 B1 | 9/2014 |
| KR | 10-1593460 B1 | 2/2016 |

* cited by examiner

CHEMICAL VAPOR DEPOSITION SYSTEM INCLUDING GROUND STRAP BAR

CROSS-REFERENCE TO RELATED APPLICATIONS

This U.S. non-provisional patent application claims priority under 35 U.S.C. § 119 to Korean Patent Application No. 10-2017-0066330, filed on May 29, 2017, in the Korean Intellectual Property Office, the entire contents of which are hereby incorporated by reference.

BACKGROUND OF THE INVENTION

The present disclosure relates to a chemical vapor deposition system, and in particular, to a chemical vapor deposition system using plasma.

A process of fabricating a display device includes a deposition process of forming a thin film on a surface of a substrate, a photolithography process, and an etching process. The thin-film deposition process includes, for example, a sputtering process and a chemical vapor deposition (CVD) process. The sputtering process, which is one of physical deposition processes, is performed to directly collide and adsorb thin-film particles to a substrate. In the case of the chemical vapor deposition process, chemical reaction of radicals is induced, and thin-film particles, which are reactants of such chemical reaction, are adsorbed or deposited on a substrate. As an example of the chemical vapor deposition process, there is a plasma chemical vapor deposition which is performed using high energy of plasma and abundant radicals.

SUMMARY

Some embodiments of the inventive concept provide a chemical vapor deposition system that is configured to allow a ground strap to be easily attached to an inner space of a chamber.

According to some embodiments of the inventive concept, a chemical vapor deposition (CVD) system may include a chamber, a susceptor provided in the chamber to support a substrate, a gas distribution part provided over the susceptor, a first ground strap bar provided on a bottom inner surface of the chamber and electrically connected to the chamber, a second ground strap bar provided on a bottom surface of the susceptor and electrically connected to the susceptor, and a plurality of ground straps electrically connected to the first ground strap bar and the second ground strap bar, each of the plurality of ground straps including two opposite portions that are fastened to the first ground strap bar and the second ground strap bar, respectively.

In some embodiments, the CVD system may further include a plurality of first ground blocks that are provided to cover first regions of the ground straps, respectively, and are fastened in common to the first ground strap bar.

In some embodiments, each of the first ground blocks may be provided to define at least one first ground block hole, the first ground strap bar may be provided to define a first strap hole overlapped with the first ground block hole, and each of the first ground blocks may be fastened to the first ground strap bar by a first bolt inserted in the first ground block hole and the first strap hole.

In some embodiments, each of the first regions may be provided to have an opening hole overlapped with the first strap hole.

In some embodiments, the CVD system may further include a plurality of second ground blocks that are provided to cover second regions of the ground straps, respectively, and are fastened in common to the second ground strap bar.

In some embodiments, each of the second ground blocks may be provided to define at least one second ground block hole, the second ground strap bar may be provided to define a second strap hole overlapped with the second ground block hole, and each of the second ground blocks may be fastened to the second ground strap bar by a second bolt inserted in the second ground block hole and the second strap hole.

In some embodiments, each of the first ground strap bar and the second ground strap bar may be provided in plural.

In some embodiments, the first ground strap bar may include a first sub-ground strap bar and a second sub-ground strap bar, which are spaced apart from and opposite to each other in a first direction, and a third sub-ground strap bar and a fourth sub-ground strap bar, which are spaced apart from and opposite to each other in a second direction crossing the first direction.

In some embodiments, one of the first to fourth sub-ground strap bars may include at least two sub-ground strap bars spaced apart from each other.

In some embodiments, the second ground strap bar may include a fifth sub-ground strap bar and a sixth sub-ground strap bar spaced apart from and opposite to each other in the first direction, and a seventh sub-ground strap bar and an eighth sub-ground strap bar spaced apart from and opposite to each other in the second direction.

In some embodiments, the first sub-ground strap bar and the third sub-ground strap bar may be provided to form a single body, and the second sub-ground strap bar and the fourth sub-ground strap bar may be provided to form a single body.

In some embodiments, the first ground strap bar may be provided to define at least one first bolt hole, the bottom inner surface of the chamber may be provided to define a first bolt-fastening region overlapped with the first bolt hole, and the first ground strap bar may be fastened to the bottom inner surface by a first body bolt inserted in the first bolt hole and the first bolt-fastening region.

In some embodiments, the second ground strap bar may be provided to define at least one second bolt hole, the bottom surface of the susceptor may be provided to define a second bolt-fastening region overlapped with the second bolt hole, and the second ground strap bar may be fastened to the bottom surface by a second body bolt inserted in the second bolt hole and the second bolt-fastening region. In some embodiments, the two opposite portions comprise a first region of the ground straps and a second region of the ground straps, respectively.

According to some embodiments of the inventive concept, a chemical vapor deposition (CVD) system may include a chamber including an top inner surface and a bottom inner surface, which are spaced apart from and opposite to each other, and a side wall, which is provided to connect the top inner surface to the bottom inner surface, a susceptor provided in the chamber to support a substrate, a gas distribution part provided over the susceptor, a plurality of first fastening clips inserted in a plurality of first fastening holes, respectively, which are defined in the bottom inner surface, and a plurality of ground straps electrically connected to the fastening clips and the susceptor, each of the plurality of ground straps including two opposite portions, one portion of the two opposite portions which is fastened to a corresponding one of the fastening clips, and an other portion of the two opposite portions which is fastened to the susceptor.

In some embodiments, the CVD system may further include a ground strap bar that is provided on a bottom surface of the susceptor and is electrically connected to the susceptor. The other portions of the ground straps may be fastened in common to the ground strap bar.

In some embodiments, the CVD system may further include a plurality of ground blocks that are provided to cover regions of the ground straps, respectively, and are fastened in common to the ground strap bar.

In some embodiments, the CVD system may further include a plurality of second fastening clips that are inserted in a plurality of second fastening holes, respectively, defined in a bottom surface of the susceptor. The one portions of the ground straps may be fastened to the second fastening clips, respectively. In some embodiments, the regions comprise a first region of the ground straps and a second region of the ground straps, and each one portion of the ground straps comprises the first region and each other portion of the ground straps comprises the second region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
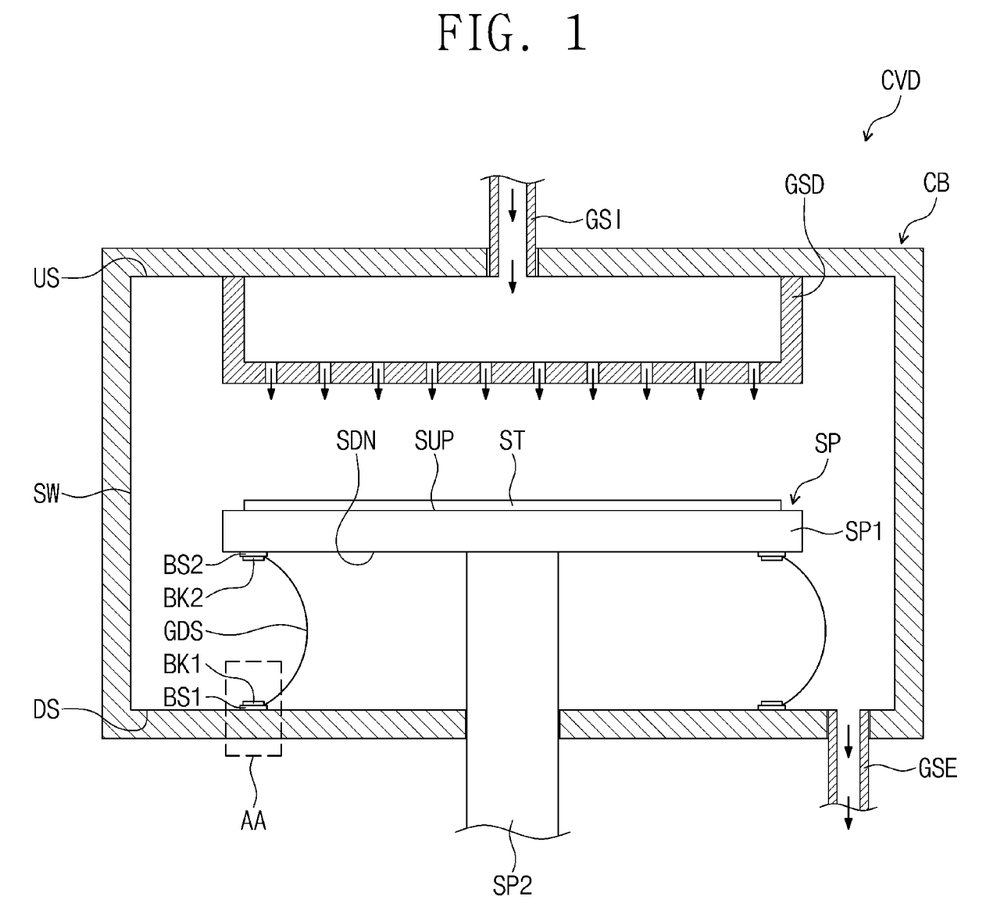
FIG. 1 is a sectional view of a chemical vapor deposition system according to some embodiments of the inventive concept.
Figure 2:
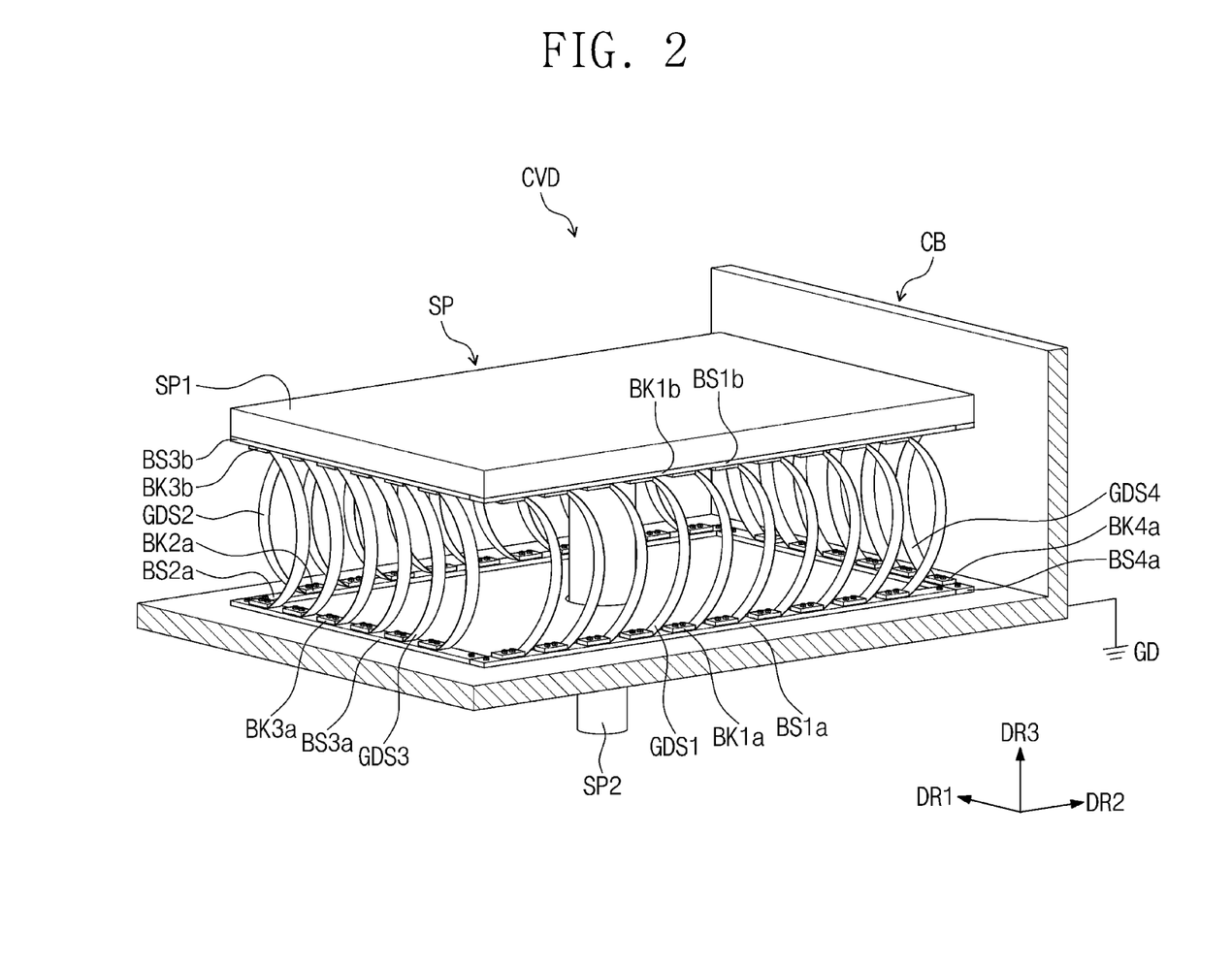
FIG. 2 is a perspective view illustrating the chemical vapor deposition system of FIG. 1, according to some embodiments of the inventive concept.

FIG. 1 is a sectional view of a chemical vapor deposition system according to some embodiments of the inventive concept. FIG. 2 is a perspective view illustrating the chemical vapor deposition system of FIG. 1, according to some embodiments of the inventive concept.

In some embodiments, a chemical vapor deposition system CVD may be provided in the form of a plasma-enhanced chemical vapor deposition system (PECVD). For the sake of simplicity, the description that follows will refer to an example in which the PECVD system is used as the chemical vapor deposition system CVD. The chemical vapor deposition system CVD may be used in a semiconductor fabrication process for fabricating an integrated circuit, a display device, or a solar cell.

Referring to FIG. 1, the chemical vapor deposition system CVD may include a chamber CB, a susceptor SP, a first ground strap bar BS1, a second ground strap bar BS2, a first ground block BK1, a second ground block BK2, a ground strap GDS, a gas injection part GSI, a gas distribution part GSD, and a gas exhausting part GSE.

The chamber CB may include a top inner surface of the chamber CB (hereinafter, an up-side surface USS, a bottom inner surface of the chamber CB (hereinafter, a down-side surface DS), and a side wall SW connecting the up-side surface US to the down-side surface DS. The chamber CB may be configured to provide an internal space, in which components of the chemical vapor deposition system CVD are disposed.

When a deposition process is performed using the chemical vapor deposition system CVD, an internal space of the chamber CB may be hermetically sealed from the outside. In this case, the gas injection part GSI and the gas exhausting part GSE may be configured to prevent external air from being supplied into the internal space of the chamber CB. Although not shown, the chamber CB may include a portion that can be selectively opened to allow a substrate to pass therethrough. For example, a portion of the side wall SW of the chamber CB may be configured to be selectively opened and closed.

The gas injection part GSI and the gas distribution part GSD may be provided near the top inner surface US of the chamber CB. The gas injection part GSI may be provided to penetrate the top inner surface US of the chamber CB and may be used to inject a process gas into the internal space of the chamber CB. In this case, the gas injection part GSI may include a portion located in the chamber CB—e.g., within the top inner surface US or the bottom inner surface DS— and another portion located outside the chamber CB.

In some embodiments, the process gas may include a mixture gas of $SiH_4$, $NH_3$, and $N_2$ for the deposition of a silicon nitride layer or may include a mixture gas of $SiH_4$ and $H_2$ for the deposition of an amorphous silicon layer. In addition, when a phosphorus (P)-doping process is performed to form a doped amorphous silicon layer (n+a-Si) with high electron mobility, $PH_3$ may be further added in the process gas for the amorphous silicon layer. A mixture gas of tetraethyl orthosilicate (TEOS), $Si(OC_2H_5)$, and $O_2$ may be used for the deposition of the silicon oxide layer.

The gas distribution part GSD may be coupled to the top inner surface US of the chamber CB and may be provided to face a substrate ST. The gas distribution part GSD may be used to supply a process gas from the gas injection part GSI to the substrate ST. In some embodiments, a plurality of through holes may be defined in the gas distribution part GSD to uniformly supply the process gas to the substrate ST.

Although not shown, an electrode plate, to which high frequency power is applied, may be provided on the top inner surface US of the chamber CB. The electrode plate may include at least one of metallic materials (e.g., aluminum, Inconel, and Hastelloy). The electrode plate may be electrically connected to the gas distribution part GSD. The susceptor SP may be connected to a ground node.

Owing to the high frequency power applied to the electrode plate, plasma may be produced between the gas distribution part GSD and the susceptor SP. In other words, due to a difference in electrical potential between the electrode plate and the susceptor SP, the process gas may be excited to produce the plasma. Under the plasma environment, radicals or reactants may be produced from the process gas and may be adsorbed onto a top surface of the substrate ST, thereby forming a thin film.

The gas exhausting part GSE may be provided to penetrate a bottom portion of the chamber CB, thereby being connected to the bottom inner surface DS. The gas exhausting part GSE may be used to exhaust the process gas from the internal space of the chamber CB to the outside of the chamber CB.

The susceptor SP may be provided to support the substrate ST. As an example, the substrate ST may include a glass substrate, a semiconductor substrate, a dielectric substrate, a polymer substrate, a fabric substrate, a metal substrate, and so forth. The susceptor SP may include at least one of metallic materials (e.g., aluminum, Inconel, and Hastelloy).

The susceptor SP may include a first susceptor SP1, which is configured to support the substrate ST, and a second susceptor SP2, which passes through the bottom inner surface DS of the chamber CB and is connected to the first susceptor SP1. The first susceptor SP1 and the second susceptor SP2 may be provided in the form of separate parts or a single part. The first susceptor SP1 may include a top surface SUP, on which the substrate ST is loaded, and a bottom surface SDN, to which the second susceptor SP2 is connected. A coupling structure between the first susceptor SP1 and the second susceptor SP2 may be variously changed depending on the arrangement of parts constituting the chemical vapor deposition system CVD.

The first susceptor SP1 may be a rectangular or circular plate configured to support the substrate ST. Although not shown, the first susceptor SP1 may include at least one of heating and cooling lines, which are configured to increase and decrease a temperature of the substrate ST.

The second susceptor SP2 may be connected to a center region of the first susceptor SP1 and may be used to support the first susceptor SP1. The second susceptor SP2 may be provided in the form of a circular or rectangular pillar.

The second susceptor SP2 may be configured to be movable in a vertically upward or downward direction, and this may be used to locate the substrate ST at a desired process position. When the second susceptor SP2 is moved, the first susceptor SP1 may be moved in the same direction as the second susceptor SP2. For example, in the case where the substrate ST is transported into the internal space of the chamber CB from the outside through the side wall SW of the chamber CB, the second susceptor SP2 may be moved in an upward direction. As a result, the substrate ST may be loaded on the first susceptor SP1. Thereafter, if the second susceptor SP2 is moved in a downward direction, the substrate ST may be located at a desired process position. However, the inventive concept is not limited thereto, and the motion of the second susceptor SP2 may be variously changed.

To produce the plasma between the susceptor SP and the gas distribution part GSD, it may be necessary to connect the susceptor SP to a ground node. In this case, the second susceptor SP2 may be coupled to the bottom inner surface DS of the chamber CB and may be electrically connected to the bottom inner surface DS.

In some embodiments, the chamber CB may be formed of or include a conductive material. For example, the chamber CB may include at least one of metallic materials (e.g., aluminum, Inconel, and Hastelloy). In particular, a portion of the chamber CB may be electrically connected to a ground terminal GD located at the outside of the chamber CB.

In other words, the high frequency power may be transmitted to the susceptor SP through the substrate ST, and the high frequency power transmitted to the susceptor SP may be transmitted to the chamber CB. As a result, the high frequency power transmitted to the chamber CB may be transmitted to the ground terminal GD.

However, in certain cases, the high frequency power, which is transmitted to the susceptor SP through the substrate ST, may be incompletely transmitted to the chamber CB through the second susceptor SP2. In this case, an arc discharge may occur.

In some embodiments, the chemical vapor deposition system CVD may include the first ground strap bar BS1, the first ground block BK1, the second ground strap bar BS2, the second ground block BK2, and the ground strap GDS.

Each of the first ground strap bar BS1, the first ground block BK1, the second ground strap bar BS2, the second ground block BK2, and the ground strap GDS may include at least one of metallic materials (e.g., aluminum, Inconel, and Hastelloy).

For example, the first ground strap bar BS1 may be provided on the bottom inner surface DS of the chamber CB, and the first ground block BK1 may be provided on the first ground strap bar BS1. The second ground strap bar BS2 may be provided on the bottom surface SDN of the first susceptor SP1, and the second ground block BK2 may be provided on the second ground strap bar BS2.

The ground strap GDS may be provided between, and electrically connected to, the first ground strap bar BS1 and the second ground strap bar BS2. The ground strap GDS may bent with a curvature, and the curvature of the ground strap GDS may be changed by a vertical motion of the second susceptor SP2.

A portion of the ground strap GDS may be fixed between the first ground strap bar BS1 and the first ground block BK1. In other words, the first ground block BK1 may be fastened to the first ground strap bar BS1 to cover the portion of the ground strap GDS.

Another portion of the ground strap GDS may be fixed between the second ground strap bar BS2 and the second ground block BK2. In other words, the second ground block BK2 may be fastened to the second ground strap bar BS2 to cover the another portion of the ground strap GDS. Here, the portion and the another portion may refer to two opposite end portions of the ground strap GDS or their neighboring portions.

In some embodiments, the ground strap GDS may be provided in plural number, and the first ground block BK1 may also be provided in plural number. The second ground block BK2 may also be provided in plural number, based on the number of the ground straps GDS.

In some embodiments, each of a plurality of the ground straps GDS may be coupled to the first ground strap bar BS1 and the second ground strap bar BS2, and then, the first ground strap bar BS1 and the second ground strap bar BS2 may be coupled to corresponding portions in the chamber CB. In a conventional example, each ground strap is instead directly fastened to a chamber and a susceptor using a bolt, without using the first ground strap bar BS1 and the second ground strap bar BS2. In such a case, connecting a plurality of ground straps to the chamber and the susceptor using respective bolts, is a difficult and time-consuming process.

In some embodiments, a process of connecting each of a plurality of the ground straps GDS to the first ground strap bar BS1 and the second ground strap bar BS2 may be performed outside the chamber CB. Thereafter, the first ground strap bar BS1 and the second ground strap bar BS2 may be connected to the chamber CB, and thus, it may be possible to reduce a process time and a process difficulty.

For convenience of illustration, only a part of the chamber CB shown in FIG. 1 is illustrated in FIG. 2.

In some embodiments, the first ground strap bar BS1 may include first to fourth sub-ground strap bars BS1$a$-BS4$a$, each of which is provided on the bottom inner surface DS of the chamber CB. The first sub-ground strap bar BS1$a$ and the second sub-ground strap bar BS2$a$ may be spaced apart from and opposite to each other in a first direction DR1. The third sub-ground strap bar BS3$a$ and the fourth sub-ground strap bar BS4$a$ may be spaced apart from and opposite to each other in a second direction DR2.

Here, the first susceptor SP1 may be a top surface that is parallel to both of the first direction DR1 and the second direction DR2. Hereinafter, a third direction DR3 may refer to a direction normal to the top surface of the first susceptor SP1. That is, the third direction DR3 may refer to a thickness direction of the first susceptor SP1. The third direction DR3 may be used to differentiate a front or top surface of each element from a back or bottom surface. However, directions indicated by the first to third directions DR1, DR2, and DR3 may be relative concepts, and in certain embodiments, they may be changed to indicate other directions.

The second ground strap bar BS2 may include fifth to eighth sub-ground strap bars BS1$b$-BS4$b$, each of which is provided on the bottom surface SDN of the first susceptor SP1. The fifth sub-ground strap bar BS1$b$ and the sixth sub-ground strap bar BS2$b$ may be spaced apart from and opposite to each other in the first direction DR1. The seventh sub-ground strap bar BS3$b$ and the eighth sub-ground strap bar BS4$b$ may be spaced apart from and opposite to each other in the second direction DR2.

The first sub-ground strap bar BS1$a$ and the fifth sub-ground strap bar BS1$b$ may be overlapped with each other, when viewed in the third direction DR3. The second sub-ground strap bar BS2$a$ and the sixth sub-ground strap bar BS2$b$ may be overlapped with each other, when viewed in the third direction DR3. The third sub-ground strap bar BS3$a$ and the seventh sub-ground strap bar BS3$b$ may be overlapped with each other, when viewed in the third direction DR3. The fourth sub-ground strap bar BS4$a$ and the eighth sub-ground strap bar BS4*b* may be overlapped with each other, when viewed in the third direction DR3.

The ground strap GDS may include a plurality of first to fourth ground straps GDS1-GDS4. Each of the first ground straps GDS1 may be placed between and connected to the first and fifth sub-ground strap bars BS1*a* and BS1*b*.

In this case, a plurality of first ground blocks BK1*a* may be provided, and in some embodiments, the number of the first ground blocks BK1*a* may be substantially equal to that of the first ground straps GDS1. The plurality of the first ground blocks BK1*a* may be provided to cover portions (e.g., end portions) of the first ground straps GDS1, respectively, and may be fastened in common to the first sub-ground strap bar BS1*a*. A plurality of fifth ground blocks BK1*b* may be provided, and in some embodiments, the number of the fifth ground blocks BK1*b* may be substantially equal to that of the first ground straps GDS1. The plurality of the fifth ground blocks BK1*b* may be provided to cover other portions (e.g., other end portions) of the first ground straps GDS1, respectively, and may be fastened in common to the fifth sub-ground strap bar BS1*b*.

Each of the second ground straps GDS2 may be placed between and connected to the second sub-ground strap bar BS2*a* and the sixth sub-ground strap bar BS2*b*.

In this case, a plurality of second ground blocks BK2*a* may be provided, and in some embodiments, the number of the second ground blocks BK2*a* may be substantially equal to that of the second ground straps GDS2. The plurality of the second ground blocks BK2*a* may be provided to cover portions of the second ground straps GDS2, respectively, and may be fastened in common to the second sub-ground strap bar BS2*a*. A plurality of sixth ground blocks BK2*b* may be provided, and in some embodiments, the number of the sixth ground blocks BK2*b* may be substantially equal to that of the second ground straps GDS2. The plurality of the sixth ground blocks BK2*b* may be provided to cover other portions of the second ground straps GDS2, respectively, and may be fastened in common to the sixth sub-ground strap bar BS2*b*.

Each of the third ground straps GDS3 may be placed between and connected to the third sub-ground strap bar BS3*a* and the seventh sub-ground strap bar BS3*b*.

In this case, a plurality of third ground blocks BK3*a* may be provided, and the number of the third ground blocks BK3*a* may correspond to that of the third ground straps GDS3. The plurality of the third ground blocks BK3*a* may be provided to cover portions of the third ground straps GDS3, respectively, and may be fastened in common to the third sub-ground strap bar BS3*a*. A plurality of seventh sub-ground blocks BK3*b* may be provided, and in some embodiments, the number of the seventh ground blocks BK3*b* may be substantially equal to that of the third ground straps GDS3. The plurality of the seventh sub-ground blocks BK3*b* may be provided to cover other portions of the third ground straps GDS3, respectively, and may be fastened in common to the seventh sub-ground strap bar BS3*b*.

Each of the fourth ground straps GDS4 may be placed between and connected to the fourth sub-ground strap bar BS4*a* and the eighth sub-ground strap bar BS4*b*.

In this case, a plurality of fourth ground blocks BK4*a* may be provided, and in some embodiments, the number of the fourth ground blocks BK4*a* may be substantially equal to that of the fourth ground straps GDS4. The plurality of the fourth ground blocks BK4*a* may be provided to cover portions of the fourth ground straps GDS4, respectively, and may be fastened in common to the fourth sub-ground strap bar BS4*a*. A plurality of eighth ground blocks BK4*b* may be provided, and in some embodiments, the number of the eighth ground blocks BK4*b* may be substantially equal to that of the fourth ground straps GDS4. The plurality of the eighth ground blocks BK4*b* may be provided to cover other portions of the fourth ground straps GDS4, respectively, and may be fastened in common to the eighth sub-ground strap bar BS4*b*.

As described above, the process of connecting each of the first to fourth ground straps GDS1-GDS4 to correspond to ones of the plurality of sub-ground strap bars may be performed outside the chamber CB. Thereafter, the sub-ground strap bars, to which the first to fourth ground straps GDS1-GDS4 are connected, may be provided in the chamber CB and then may be coupled to corresponding portions. As an example, the first and fifth sub-ground strap bars BS1*a* and BS1*b* connected with the first ground straps GDS1 may be coupled to corresponding portions, in the chamber CB.

In other words, a process of coupling the ground straps to the sub-ground strap bar may be performed in a large space outside the chamber CB, not in a relatively smaller space in the chamber CB. Thereafter, the sub-ground strap bars may be coupled to the bottom inner surface DS of the chamber CB and the bottom surface SDN of the first susceptor SP1, respectively. Accordingly, a process of disposing the ground straps in the chamber CB may be easily performed with a reduced process time.

Figure 3:
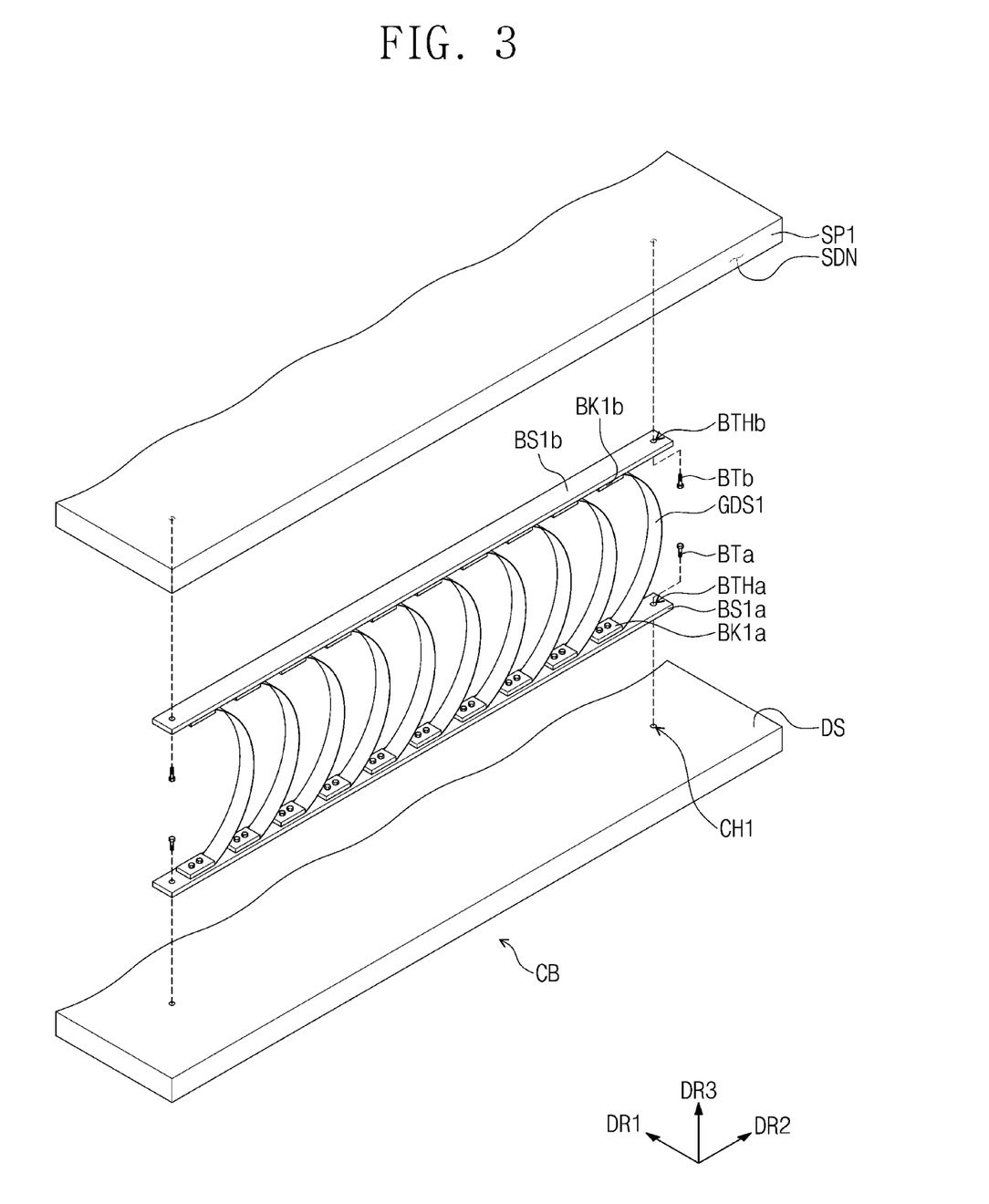
FIG. 3 is a diagram illustrating a ground strap bar of FIG. 2, which is coupled in a chamber.

FIG. 3 is an exploded perspective view illustrating a ground strap bar of FIG. 2, which is coupled in a chamber. The following description with reference to FIG. 3 will refer to an arrangement structure, in the chamber CB, of the first and fifth sub-ground strap bars BS1*a* and BS1*b* that are connected with the first ground straps GDS1 of FIG. 2. The others of the sub-ground straps may be coupled to corresponding parts in the chamber CB in the same manner as that described with reference to FIG. 3, and thus, a detailed description thereof will be omitted.

As described above, the process of coupling each of the first ground straps GDS1 to the first and fifth sub-ground strap bars BS1*a* and BS1*b* may be performed outside the chamber CB. Thereafter, the first and fifth sub-ground strap bars BS1*a* and BS1*b* may be coupled to the bottom inner surface DS of the chamber CB and the bottom surface SDN of the first susceptor SP1, respectively.

In detail, the first sub-ground strap bar BS1*a* may include first bolt holes BTHa that are defined at opposite edge portions thereof. When viewed in a plan view normal to the third direction DR3, the bottom inner surface DS may include first bolt-fastening regions CH1 overlapped with the first bolt holes BTHa, respectively. A first body bolt BTa may be connected to the first bolt-fastening region CH1 through the first bolt hole BTHa, and thus, the first sub-ground strap bar BS1*a* may be fixed to the bottom inner surface DS of the chamber CB.

The fifth sub-ground strap bar BS1*b* may include second bolt holes BTHb that are defined at opposite edge portions thereof. When viewed in a plan view normal to the third direction DR3, the bottom surface SDN of the first susceptor SP1 may include second bolt-fastening regions (not shown) overlapped with the second bolt holes BTHb, respectively. A second body bolt BTb may be connected to the second bolt-fastening region through the second bolt hole BTHb, and thus, the fifth sub-ground strap bar BS1*b* may be fixed to the bottom surface SDN of the first susceptor SP1.

As described above, since the first and fifth sub-ground strap bars BS1*a* and BS1*b* are fixed to the bottom inner surface DS and the bottom surface SDN, respectively, the first ground straps GDS1 may be disposed in the internal space of the chamber CB.

As a result, a high frequency power transmitted from the substrate ST (e.g., see FIG. 1) may be sequentially transmitted to the first susceptor SP1, the fifth sub-ground strap bar BS1b, the first ground straps GDS1, the first sub-ground strap bar BS1a, and the chamber CB in the order listed. The high frequency power transmitted to the chamber CB may be transmitted to the ground terminal GD (e.g., see FIG. 2).

Figure 4:
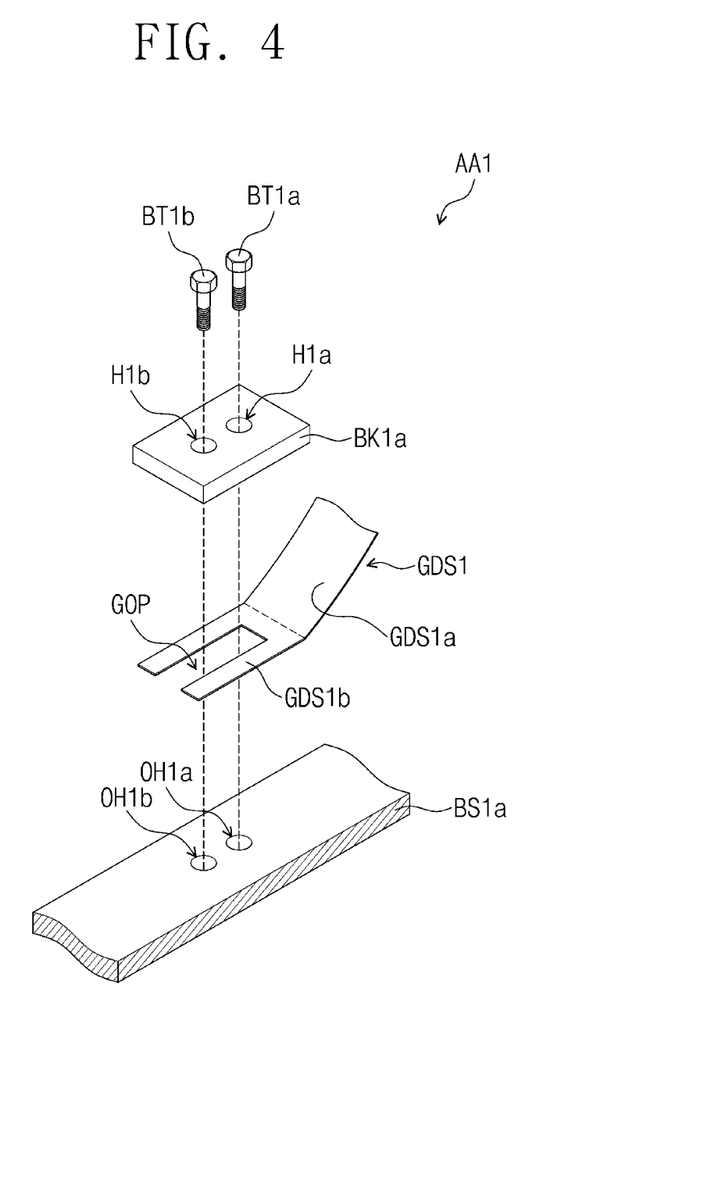
FIG. 4 is an enlarged view illustrating a region 'AA' of FIG. 1, according to some embodiments of the inventive concept.
Figure 5:
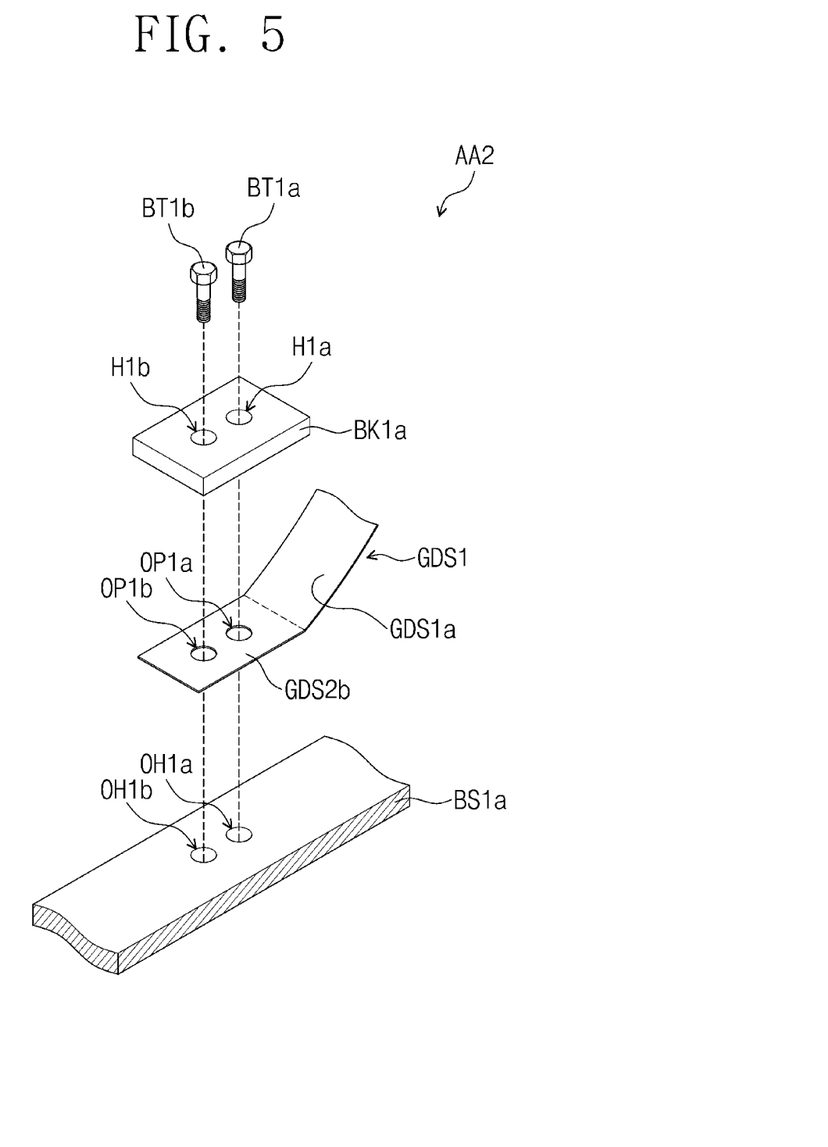
FIG. 5 is an enlarged view illustrating a region 'AA' of FIG. 1, according to other embodiments of the inventive concept.

FIG. 4 is an enlarged view illustrating the region 'AA' (hereinafter, AA1) of FIG. 1, according to some embodiments of the inventive concept. FIG. 5 is an enlarged view illustrating the region 'AA' (hereinafter, AA2) of FIG. 1, according to other embodiments of the inventive concept.

Referring to FIG. 4, a plurality of strap holes, which are used for coupling with the first ground blocks BK1a, may be defined in the first sub-ground strap bar BS1a. As shown in FIG. 4, a pair of first strap holes OH1a and OH1b, which are overlapped with the first ground blocks BK1a, respectively, may be defined in the first sub-ground strap bar BS1a. But the inventive concept is not limited thereto, and at least one first strap hole may be defined to be overlapped with each of the first ground blocks BK1a.

A pair of first ground block holes H1a and H1b, which are overlapped with the first strap holes OH1a and OH1b, respectively, may be defined in each of the first ground blocks BK1a. First bolts BT1a and BT1b may be coupled to the first ground block holes H1a and H1b and the first strap holes OH1a and OH1b, and thus, the first ground blocks BK1a may be fixed to the first sub-ground strap bar BS1a.

Although not shown, a plurality of strap holes, which are used for coupling with the fifth ground blocks BK1b, may be defined in the fifth sub-ground strap bar BS1b. In addition, block holes overlapped with the strap holes may be defined in each of the fifth ground blocks BK1b. Bolts may be coupled to the block holes defined in the fifth ground blocks BK1b and the strap holes defined in the fifth sub-ground strap bar BS1b, and thus, the fifth ground blocks BK1b may be fixed to the fifth sub-ground strap bar BS1b.

In addition, the first ground strap GDS1 may include a body region GDS1a, a first region GDS1b, and a second region (not shown), and here, the first and second regions may extend from opposite portions of the body region GDS1a. The first region GDS1b and the second region may be provided to have the same structure. Here, the first region GDS1b may be covered with the first ground block BK1a, and the second region may be covered with the fifth ground block BK1b.

In some embodiments, the first region GDS1b may include an opening GOP. The first bolts BT1a and BT1b may be overlapped with the opening GOP. The first bolts BT1a and BT1b may be coupled to the first strap holes OH1a and OH1b, and then, the first region GDS1b may be inserted into a gap between the first ground block BK1a and the first sub-ground strap bar BS1a in a sliding manner. The opening GOP may be provided to have, for example, a rectangular shape.

The opening GOP may have a shape extending from an end of the first region GDS1b, and this may allow the first region GDS1b to be covered with the first ground block BK1a. Here, the end of the first region GDS1b may be spaced apart from and opposite to another end of the first region GDS1b connected to the body region GDS1a.

The first ground strap GDS1 of FIG. 5 may have the same structure as the first ground strap GDS1 of FIG. 4, except for differences associated with the first region GDS1b and the second region.

Referring to FIG. 5, a first region GDS2b may be provided to have openings OP1a and OP1b, allowing the first bolts BT1a and BT1b to passing therethrough. In this case, before coupling the first bolts BT1a and BT1b to the first strap holes OH1a and OH1b, the first region GDS2b may be arranged on the first sub-ground strap bar BS1a in such a way that the openings OP1a and OP1b are overlapped with the first strap holes OH1a and OH1b. Thereafter, the first bolts BT1a and BT1b may be respectively inserted into the first ground block holes H1a and H1b, the openings OP1a and OP1b, and the first strap holes OH1a and OH1b. As a result, the first ground block BK1a may be fixed to the first sub-ground strap bar BS1a, and the first region GDS2b may be covered with the first ground block BK1a.

Figure 6:
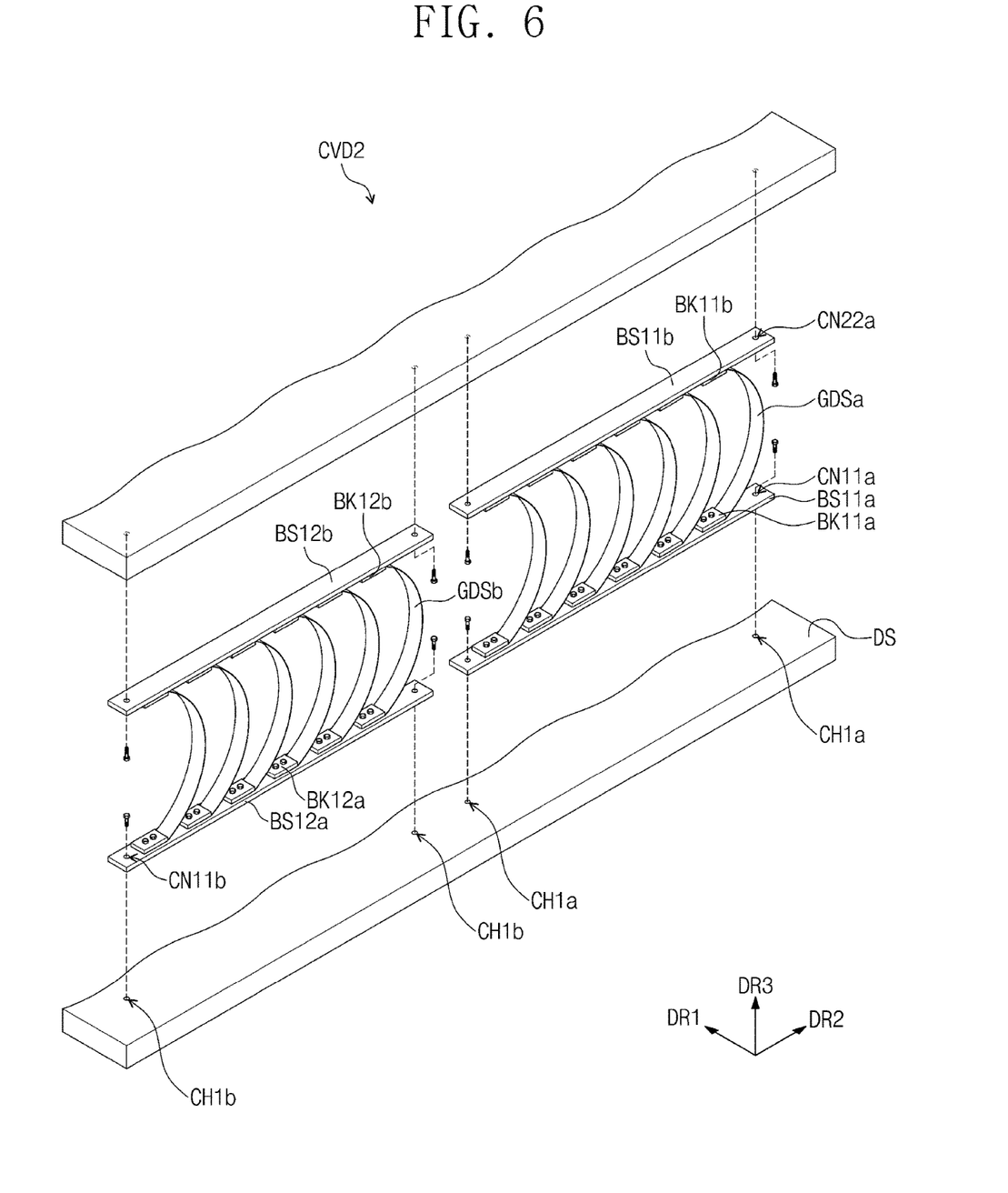
FIG. 6 is a perspective view of a chemical vapor deposition system according to other embodiments of the inventive concept.

FIG. 6 is a perspective view of a chemical vapor deposition system according to other embodiments of the inventive concept. A chemical vapor deposition system CVD2 of FIG. 6 may be configured to have substantially the same structure as the chemical vapor deposition system CVD of FIG. 2, except for differences associated with the sub-ground strap bar. Thus, for concise description, a previously described element may be identified by a similar or identical reference number without repeating an overlapping description thereof.

In addition, some (e.g., the first and fifth sub-ground strap bars) of the first to eighth sub-ground strap bars shown in FIG. 2 will be described with reference to FIG. 6, but the others may have the same structure as the first and fifth sub-ground strap bars.

Referring to FIG. 6, the first sub-ground strap bar BS1a may be provided to have a divided structure, unlike that illustrated in FIG. 2. For example, the first sub-ground strap bar BS1a may include a first strap bar BS11a and a second strap bar BS12a. The first strap bar BS11a and the second strap bar BS12a may be spaced apart from each other. The fifth sub-ground strap bar BS1b may include a third strap bar BS11b and a fourth strap bar BS12b. The third strap bar BS11b and the fourth strap bar BS12b may be spaced apart from each other.

A plurality of first sub-ground straps GDSa may be connected to the first strap bar BS11a and the third strap bar BS11b. A plurality of second sub-ground straps GDSb may be connected to the second strap bar BS12a and the fourth strap bar BS12b.

In addition, a plurality of first sub-ground blocks BK11a may be provided to cover portions of the first sub-ground straps GDSa, respectively, and may be fastened in common to the first strap bar BS11a. A plurality of second sub-ground blocks BK12a may be provided to cover portions of the second sub-ground straps GDSb, respectively, and may be fastened in common to the second strap bar BS12a. A plurality of third sub-ground blocks BK11b may be provided to cover other portions of the third sub-ground straps GDSa, respectively, and may be fastened in common to the third strap bar BS11b. A plurality of fourth sub-ground blocks BK12b may be provided to cover other portions of the second sub-ground straps GDSDb, respectively, and may be fastened in common to the fourth strap bar BS12b.

The bottom inner surface DS of the chamber CB may be provided to have a first bolt-fastening region CH1a, to which the first strap bar BS11a is fastened, and a second bolt-fastening region CH1b, to which the second strap bar BS12a is fastened.

As previously described with reference to FIG. 6, the first sub-ground strap bar BS1a shown in FIG. 2 may be provided to have a divided structure. Furthermore, a ground strap bar parallel to a long side of the substrate ST may have the divided structure that is substantially the same as that of the first sub-ground strap bar BS1a. For example, the first and third sub-ground strap bars BS1a and BS3a may be longer than the second and fourth sub-ground strap bars BS2a and BS4a (e.g., see FIG. 2). In this case, since the first sub-ground strap bar BS1a has the structure that is divided into the first strap bar BS11a and the second strap bar BS12a, it may be possible to more easily fasten the first strap bar BS11a and the second strap bar BS12a to the bottom inner surface DS of the chamber CB. As an example, it may be possible to more easily align the first strap bar BS11a and the second strap bar BS12a to the bolt-fastening regions CH1a and CH1b defined in the bottom inner surface DS.

Figure 7:
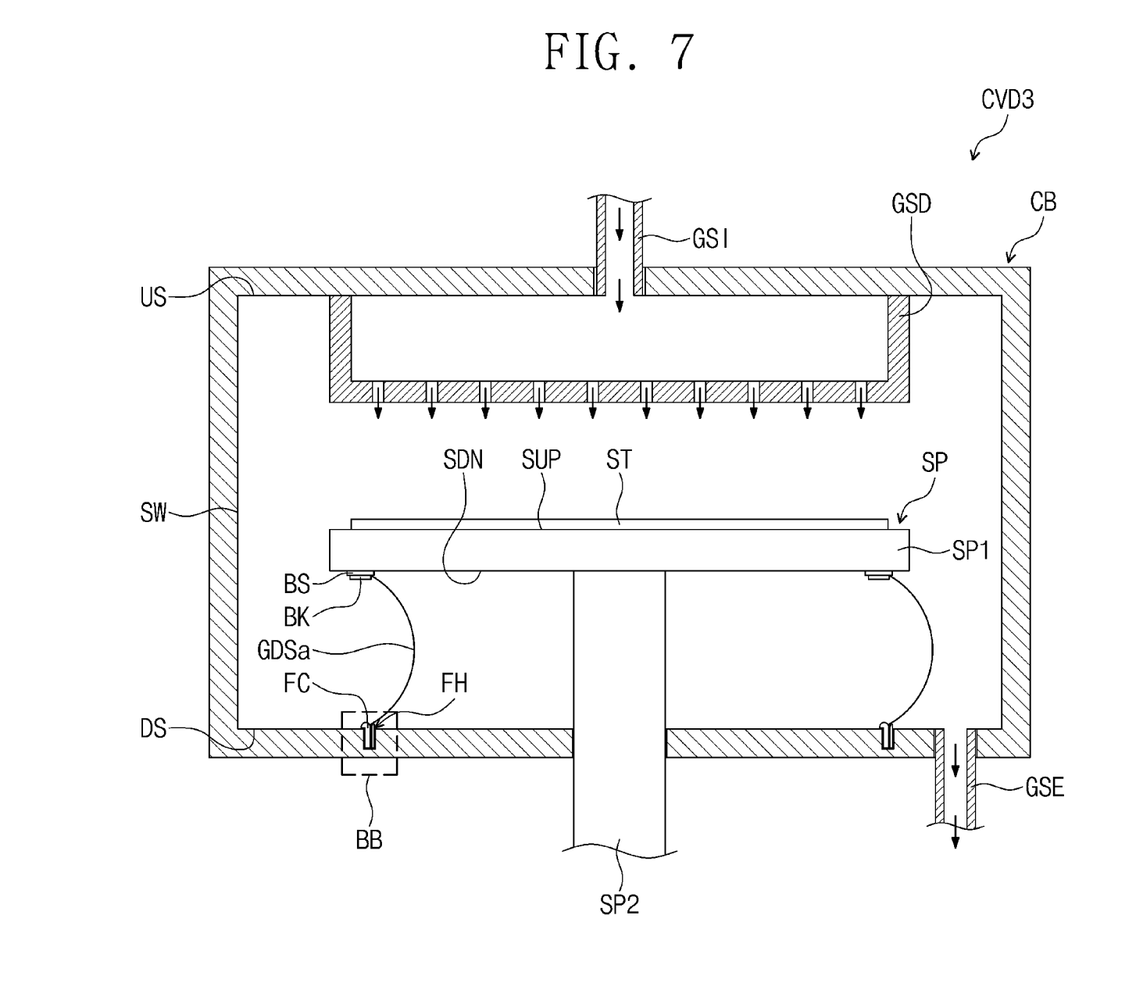
FIG. 7 is a sectional view of a chemical vapor deposition system according to other embodiments of the inventive concept.
Figure 8:
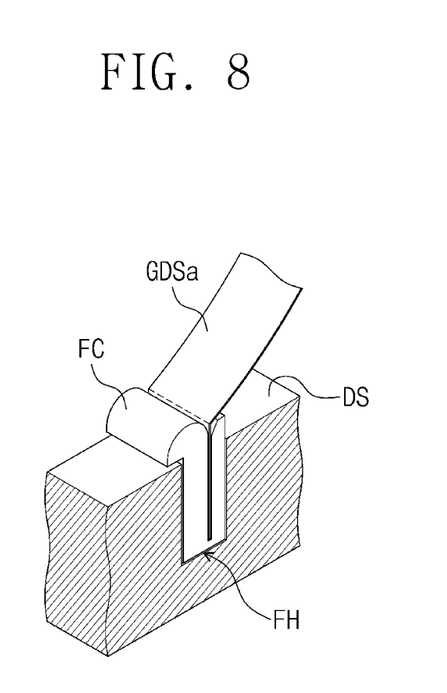
FIG. 8 is an enlarged view of a region 'BB' shown in FIG. 7.

FIG. 7 is a sectional view of a chemical vapor deposition system according to other embodiments of the inventive concept. FIG. 8 is an enlarged view of a region 'BB' shown in FIG. 7.

A chemical vapor deposition system CVD3 shown in FIG. 7 may be configured to have substantially the same structure as the chemical vapor deposition system CVD shown in FIG. 2, except for differences associated with the sub-ground strap bars provided on the bottom inner surface DS. Thus, for concise description, a previously described element may be identified by a similar or identical reference number without repeating an overlapping description thereof.

Referring to FIGS. 7 and 8, the bottom inner surface DS of the chamber CB may be provided to have fastening holes FH, in which portions of the ground straps GDSa can be inserted. The number of the fastening holes FH may be substantially equal to that of the ground straps GDSa. In some embodiments, a fastening clip FC may be provided in the fastening hole FH. The fastening clip FC may include at least one of metallic materials (e.g., aluminum, Inconel, and Hastelloy). The fastening clip FC may be configured to have a structure, allowing a portion of the ground strap GDSa to be coupled thereto in a sliding manner, but a shape of the fastening clip FC may be variously changed.

In the case where the portion of the ground strap GDSa is inserted into the fastening clip FC, the portion of the ground strap GDSa may be fixed to the fastening clip FC.

As described above, the portion of the ground strap GDSa may be connected to the fastening clip FC provided in the fastening hole FH, and the other portion of the ground strap GDSa may be covered with a block BK and may be connected to a sub-ground strap bar BS that is connected to the bottom surface SDN of the first susceptor SP1.

But the inventive concept is not limited thereto. For example, the bottom surface SDN of the first susceptor SP1 may have fastening holes, and the other portion of the ground strap GDSa may be inserted into each of the fastening holes of the bottom surface SDN. The number of the fastening holes may be substantially equal to that of the ground straps GDSa, and fastening clips may be provided on the bottom surface SDN. The other portion of the ground strap GDSa may be connected to a corresponding one of the fastening clips provided on the bottom surface SDN.

Figure 9:
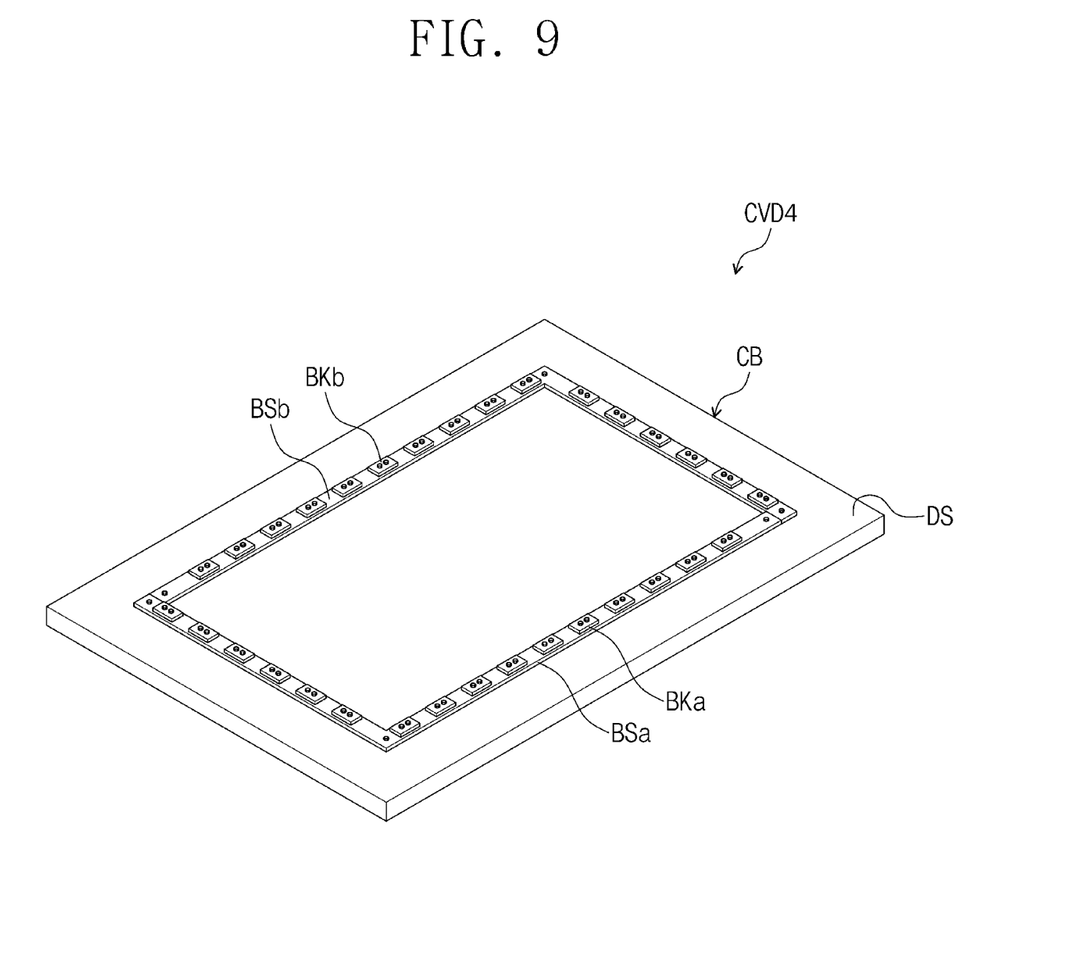
FIG. 9 is a perspective view of a chemical vapor deposition system according to other embodiments of the inventive concept.

FIG. 9 is a perspective view of a chemical vapor deposition system according to other embodiments of the inventive concept.

A chemical vapor deposition system CVD4 shown in FIG. 9 may be configured to have substantially the same structure as the chemical vapor deposition system CVD shown in FIG. 1, except for differences associated with the sub-ground strap bars provided on the bottom inner surface DS. Thus, for concise description, a previously described element may be identified by a similar or identical reference number without repeating an overlapping description thereof.

Referring to FIG. 9, a pair of sub-ground strap bars BSa and BSb may be provided on the bottom inner surface DS. For example, the first sub-ground strap bar BS1a and the third sub-ground strap bar BS3a shown in FIG. 2 may be connected to each other, thereby forming a single body serving as the sub-ground strap bar BSa. Also, the second sub-ground strap bar BS2a and the fourth sub-ground strap bar BS4a shown in FIG. 2 may be connected to each other, thereby forming a single body serving as the sub-ground strap bar BSb.

A plurality of blocks BKa and BKb corresponding to the ground straps may be provided on each of the sub-ground strap bars BSa and BSb.

Similarly, although not shown, a pair of the sub-ground strap bars BSa and BSb and a pair of the sub-ground strap bars may be provided on the bottom surface SDN of the first susceptor SP1.

According to some embodiments of the inventive concept, a plurality of ground straps are attached to a ground strap bar, and then, the ground strap bar is disposed in a chamber. In other words, it may be possible to simultaneously arrange a plurality of the ground straps in the chamber, not in a manner to arrange each of the ground straps in the chamber.

As a result, it may be possible to easily arrange the ground straps in the chamber with a reduced process time.

While example embodiments of the inventive concepts have been particularly shown and described, it will be understood by one of ordinary skill in the art that variations in form and detail may be made therein without departing from the spirit and scope of the attached claims.

What is claimed is:

1. A chemical vapor deposition (CVD) system, comprising:
   a chamber;
   a susceptor provided in the chamber to support a substrate;
   a gas distribution part provided over the susceptor;
   a first ground strap bar provided on a bottom inner surface of the chamber and directly connected to the bottom inner surface of the chamber;
   a second ground strap bar provided on a bottom surface of the susceptor to face the first ground strap bar and electrically connected to the susceptor; and
   a plurality of ground straps electrically connected to the first ground strap bar and the second ground strap bar, each of the plurality of ground straps comprising two opposite portions that are fastened to the first ground strap bar and the second ground strap bar, respectively, the plurality of ground straps comprising three or more ground straps;
   wherein the first ground strap bar extends in a first direction along a length of the first ground strap bar, said length of the first ground strap bar having a first end and a second end, said length of the first ground strap bar corresponding to an edge of the susceptor,
   wherein the second ground strap bar extends in the first direction along a length of the second ground strap bar, said length of the second ground strap bar having a first end and a second end, said length of the second ground strap bar corresponding to the edge of the susceptor, and wherein the plurality of ground straps are fastened to the first ground strap bar along the length of the first ground strap bar in between the first end and second end of the first ground strap bar; and wherein the plurality of ground straps are fastened to the second ground strap bar along the length of the second ground strap bar in between the first end and the second end of the second ground strap bar.

2. The CVD system of claim 1, further comprising a plurality of first ground blocks that are provided to cover first regions of the plurality of ground straps, respectively, and are fastened in common to the first ground strap bar.

3. The CVD system of claim 2, wherein each of the first ground blocks is provided to define at least one first ground block hole, the first ground strap bar is provided to define a first strap hole overlapped with the first ground block hole, and each of the first ground blocks is fastened to the first ground strap bar by a first bolt inserted in the first ground block hole and the first strap hole.

4. The CVD system of claim 3, wherein each of the first regions is provided to have an opening hole overlapped with the first strap hole.

5. The CV system of claim 2, further comprising a plurality of second ground blocks that are provided to cover second regions of the plurality of ground straps, respectively, and are fastened in common to the second ground strap bar.

6. The CVD system of claim 5, wherein each of the second ground blocks is provided to define at least one second ground block hole, the second ground strap bar is provided to define a second strap hole overlapped with the second ground block hole, and each of the second ground blocks is fastened to the second ground strap bar by a second bolt inserted in the second ground block hole and the second strap hole.

7. The CVD system of claim 1, wherein each of the first ground strap bar and the second ground strap bar is provided in plural.

8. The CVD system of claim 7, wherein the first ground strap bar comprises:
   a first sub-ground strap bar and a second sub-ground strap bar spaced apart from and opposite to each other in a first direction; and
   a third sub-ground strap bar and a fourth sub-ground strap bar spaced apart from and opposite to each other in a second direction crossing the first direction.

9. The CVD system of claim 8, wherein the second ground strap bar comprises:
   a fifth sub-ground strap bar and a sixth sub-ground strap bar spaced apart from and opposite to each other in the first direction; and
   a seventh sub-ground strap bar and an eighth sub-ground strap bar spaced apart from and opposite to each other in the second direction.

10. The CVD system of claim 8, wherein the first sub-ground strap bar and the third sub-ground strap bar are provided to form a single body, and
   the second sub-ground strap bar and the fourth sub-ground strap bar are provided to form a single body.

11. The CVD system of claim 1, wherein the first ground strap bar is provided to define at least one first bolt hole,
   the bottom inner surface of the chamber is provided to define a first bolt-fastening region overlapped with the first bolt hole, and
   the first ground strap bar is fastened to the bottom inner surface by a first body bolt inserted in the first bolt hole and the first bolt-fastening region.

12. The CVD system of claim 1, wherein the second ground strap bar is provided to define at least one second bolt hole,
   the bottom surface of the susceptor is provided to define a second bolt-fastening region overlapped with the second bolt hole, and
   the second ground strap bar is fastened to the bottom surface by a second body bolt inserted in the second bolt hole and the second bolt-fastening region.

13. The CVD system of claim 1, wherein the two opposite portions of each of the plurality of ground straps comprise a first region of each of the plurality of ground straps and a second region of each of the plurality of ground straps, respectively.

* * * * *